(12) United States Patent
Yang et al.

(10) Patent No.: US 6,984,594 B2
(45) Date of Patent: Jan. 10, 2006

(54) DEPOSITION METHOD OF INSULATING LAYERS HAVING LOW DIELECTRIC CONSTANT OF SEMICONDUCTOR DEVICES

(75) Inventors: Sung-Hoon Yang, Seoul (KR); Glenn A. Cerny, Midland, MI (US); Kyuha Chung, Seoul (KR); Byung-Keun Hwang, Midland, MI (US); Wan-Shick Hong, Seoul (KR)

(73) Assignee: Samsung Electronics, Co., Ltd., Suwon (KR)

( * ) Notice: Subject to any disclaimer, the term of this patent is extended or adjusted under 35 U.S.C. 154(b) by 331 days.

(21) Appl. No.: 10/150,480

(22) Filed: May 17, 2002

(65) Prior Publication Data

US 2003/0215970 A1    Nov. 20, 2003

(30) Foreign Application Priority Data

May 17, 2002  (KR)  ................................ 2002-27413

(51) Int. Cl.
*H01L 21/31*    (2006.01)

(52) U.S. Cl. ..................................... 438/789; 438/786
(58) Field of Classification Search ................. 438/30, 438/786, 789
See application file for complete search history.

(56) References Cited

U.S. PATENT DOCUMENTS 6,593,248 B2 *    7/2003    Loboda et al. ............... 438/758

* cited by examiner

*Primary Examiner*—Alexander Ghyka
(74) *Attorney, Agent, or Firm*—F. Chau & Associates, LLC

(57) ABSTRACT

The present invention relates to a process for vapor depositing a low dielectric insulating film, and more particularly to a process for vapor deposition of low dielectric insulating film that can significantly improve a vapor deposition speed while maintaining properties of the low dielectric insulating film, thereby solving parasitic capacitance problems to realize a high aperture ratio structure, and can reduce a process time by using silane gas when vapor depositing an insulating film by a CVD or PECVD method to form a protection film for a semiconductor device.

6 Claims, 5 Drawing Sheets

DEPOSITION METHOD OF INSULATING LAYERS HAVING LOW DIELECTRIC CONSTANT OF SEMICONDUCTOR DEVICES

BACKGROUND OF THE INVENTION (a) Field of the Invention

The present invention relates to a method for vapor depositing a low dielectric insulating film, and more particularly to a method for vapor depositing a low dielectric insulating film that can significantly increase a vapor deposition speed of a low dielectric insulating film by adding silane gas ($SiH_4$) in a CVD or PECVD process used for forming a protection film of a semiconductor device.

(b) Description of the Related Art

A thin film transistor substrate is used as a circuit substrate for independently operating each pixel in a liquid crystal display, an organic EL (electro luminescence) display, etc. A thin film transistor substrate comprises scanning signal wiring for transmitting scanning signals and picture image signal lines for transmitting picture image signals or data wiring, a thin film transistor connected with gate wiring and the data wiring, pixel electrodes connected with the thin film transistor, a gate insulating film covering the gate wiring to insulate the same, and a protection film covering the data wiring to insulate the same. The thin film transistor comprises a semiconductor layer which forms a channel with a gate electrode that is a part of the gate wiring, source electrodes and drain electrodes that are part of the data wiring, a gate insulating film, and a protection film. A thin film transistor is a switching device which transmits or blocks picture image signals that are transmitted through the data wiring according to scanning signals transmitted through the gate wiring to the pixel electrodes.

The thin film transistor substrate is most commonly used in a liquid crystal display device. As the liquid crystal display device gradually becomes large and fixed, signal-twisting due to an increase in various parasitic capacitances is becoming more problematic. Further, in accordance with the need to improve brightness to increase the visibility range in a liquid crystal display device for a TV and to decrease power consumption in personal computers, an increase in an aperture ratio is needed. In order to increase the aperture ratio, pixel electrodes must be formed overlapping data wiring, but in such a case, the parasitic capacitance between the pixel electrodes and the data wiring increases.

In order to solve the problems caused by an increase in parasitic capacitance, the perpendicular spacing between the pixel electrodes and data lines should be sufficiently secured. In order to secure the perpendicular spacing, the protection film is formed of an organic insulating film. However, a process using an organic insulating film has the following disadvantages. First, the material is expensive. That is, there is a substantial amount of loss during spin coating, which increases material costs. Next, the organic film has minimal heat resistance and thus many limitations are given to subsequent processes. In addition, due to the agglomeration of material, impurity particles are frequently produced, the adhesive strength between an upper film and lower film is low, and etching errors are very large when forming pixel electrodes on a protection film.

Generally, $SiO_2$ and SiN dielectric thin films are used for preparing various shapes of electric devices. There have been ongoing studies of optimized processes for preparing optical wave guides for flat panel displays from silicone IC's.

The material provides the requirements of all devices and strong electrical and mechanical properties. Recently, in order to improve the performance of devices, a conductive layer is more closely contacted or adhered closely together. In addition, in presently used devices, a lower power consumption necessary to allow operation using a battery is considered to be important rather than regular AC coupling. Therefore, in order to decrease electrical capacity coupling causing higher power consumption and slower operation speed, new material having a low dielectric constant is needed.

In order to solve these problems, material based on a Si—C bond of low density exclusive of additional functional groups is used. The material exhibits a low density and thus has a low dielectric constant. Such material is a-SiCOH or silicon oxycarbide, and exhibits a low dielectric constant of 2.7 to 3.5 and thus can greatly improve the performance of a semiconductor device.

Accordingly, if a low dielectric insulating film that is vapor-deposited by a CVD method such as a-SiCOH, a-Si:O:F, etc. is used as an interlayer insulating film and a protection film for a TFT-LCD panel, a coupling capacitance between data wiring and pixel electrodes decreases to lower an RC time delay and cross-talk. Particularly, for a super-high aperture ratio, the pixel electrodes should overlap the data electrodes. However, a $SiN_x$ protection film, which is one of the existing protection films, has a very large load capacitance and thus picture images are difficult to realize. Therefore, a dielectric constant of an insulating protection film should be made low as soon as possible, and a sufficient spacing in the perpendicular direction by increasing a thickness of a protection film is necessary. To realize this, a protection film that is vapor-deposited by the CVD method is mainly used.

In order to decrease the coupling capacitance in a-SiCOH film, there is needed a low dielectric interlayer insulating film vapor-deposited by the CVD method, according to its uses, and having a thickness of several micrometers. Since insulating thin films commonly used in semiconductor process are several millimeters in thickness, to compensate a drop in throughput resulting from the significant thickness, a very rapid vapor deposition speed is needed.

a-SiCOH thin film is typically vapor deposited by a PECVD (plasma enhanced chemical vapor deposition) method by adding an oxidant such as $N_2O$ or $O_2$ and inert gases such as Ar or He for improving uniformity and stabilizing properties to main source gas $SiH(CH_3)_3$ (hereinafter referred to as Z3MS™). For the a-SiCOH thin film, if the flow rate of source gas (for example, trimethylsilane), vapor deposition speed is known to also increase.

However, in the above method, the mechanical strength decreases as the flow rate of the main source gas increases to result in the formation of a thin film that is soft so as to be damaged in subsequent processes. Also, production costs increase because of the increased consumption of the comparatively expensive source gas. Further, if changes are made to various parameters in the CVD vapor deposition process so a, to have the lowest dielectric constant (k), the dielectric constant rapidly increases, thereby making it necessary to further increase thickness. As shown in FIG. 1, as flow rate [Z3MS+$N_2O$] of total source gases increases, the dielectric constant linearly increases.

SUMMARY OF THE INVENTION

In order to solve the problems of the prior art, it is an object of the present invention to provide a process for vapor depositing a low dielectric insulating film for a semiconductor device that can reduce a process time and significantly improve a vapor deposition speed while maintaining a low dielectric constant and other physical properties to solve the problem of parasitic capacitance, thereby realizing a high aperture ratio structure.

It is another object of the present invention to provide a semiconductor device prepared using an insulating film vapor deposited by the above process as a protection film, and a process for preparing the same.

In order to achieve these objects, the present invention provides a process for vapor depositing a low dielectric insulating film for a semiconductor device comprising the step of adding a reactant gas mixture comprising a gas phase main source, $SiH_4$, and an oxidant to a vapor deposition chamber comprising a substrate to vapor deposit a-SiCOH thin film by a CVD or PECVD method.

The present invention also provides a semiconductor device comprising a low dielectric insulating film vapor deposited by the method as a protection film.

Wherein, the low dielectric insulating film can be used for protection film at least one of the first insulating film, second insulating film, buffer layer, gate insulating film and protection film pattern of the semiconductor device. The semiconductor device is preferable TFT-panel.

DETAILED DESCRIPTION AND THE PREFERRED EMBODIMENTS

Figure 1:
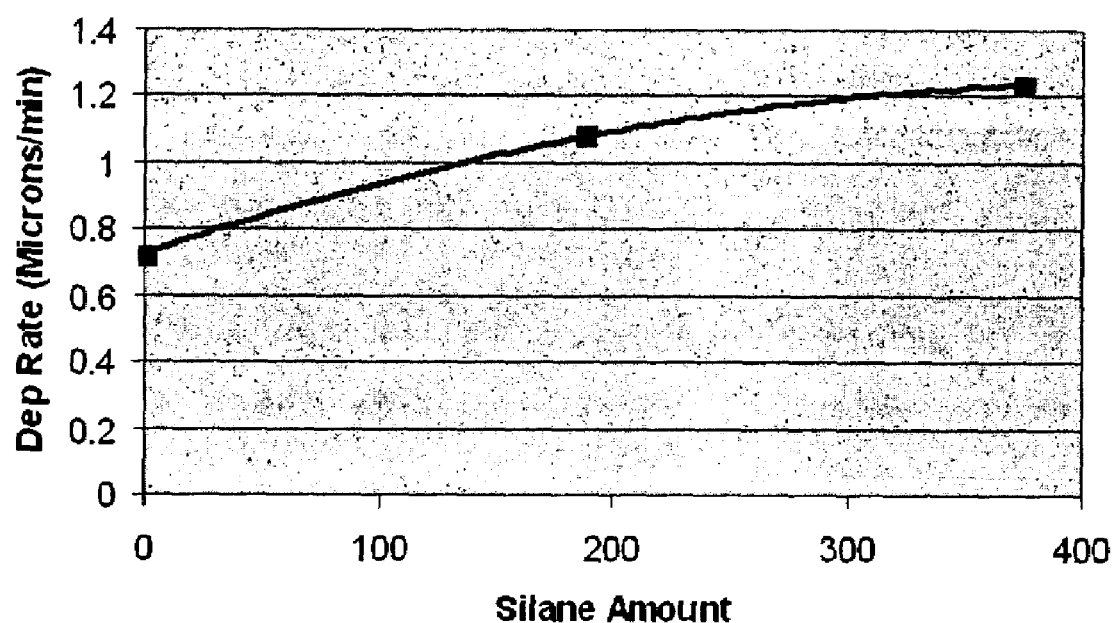
FIG. 1 shows effects of improvement in a-SiCOH thin film vapor deposition speed according to the addition of silane ($SiH_4$) gas.

The present invention will now be explained in detail.

The present invention is characterized in that a vapor deposition speed is improved while maintaining other physical properties of a low dielectric insulating film (an a-SiCOH thin film) by adding silane ($SiH_4$) gas to source gas when forming a protection film for a semiconductor device such as a TFT-LCD.

Thus, the present invention can solve parasitic capacitance problems to realize a high aperture ratio structure, and can reduce a process time.

The a-SiOCH thin film (low dielectric insulating film) can be obtained by adding a reactant gas mixture comprising a gas phase main source, silane ($SiH_4$), and an oxidant to a vapor deposition chamber comprising a substrate by a CVD or PECVD method. In order to improve uniformity and stabilize properties, inert gas such as Ar or He can be included.

Preferably, vapor deposition is performed by a PECVD (plasma enhanced chemical vapor deposition) method conducted by exposing a reactant gas mixture to plasma at a power density of 0.2 to 1.5 $mW/cm^2$, a temperature of 25 to 300° C., and under a pressure of 1 to 10,000 Torr.

In order to manufacture the a-SiCOH thin film (low dielectric film) having a dielectric constant of 3.6 or less and a light transmittance of 95% or more at a wavelength range of 400 to 800 nm, it is important to control the amounts of silane and oxidant during reaction.

Therefore, the ratio of silane ($SiH_4$) gas to main source gas is preferably 1:0.5 to 1. If this range is exceeded, the dielectric constant increases and thus the vapor deposition speed cannot be improved.

The dielectric constant of the low dielectric insulating film is preferably 2 to 3. Also, a thickness of the protection film is preferably 1.5 $\mu m$ or more, and more preferably 1.5 to 4.0 $\mu m$. The substrate is preferably selected from the group consisting of a liquid crystal display device, a light emitting diode display device, and an organic light emitting diode display device, and more preferably the substrate is a liquid crystal display device.

The main source gas is preferably selected as one or more in the group consisting of organosilicon compounds represented by the following Chemical Formulae 1, 2 and 3.

$SiH_x(CH_3)_{4-x}$ [Chemical Formula 1]

wherein, x is an integer, that is, 0, 1, 2 or 4,

$Si(OR^1)_x R^2_{4-x}$ [Chemical Formula 2]

wherein, $R^1$ and $R^2$ are independently or simultaneously straight or branched C1–10 alkyl or alkenyl group substituted or unsubstituted by C1–5 alkyl or alkenyl group, and preferably $R^1$ and $R^2$ are independently or simultaneously methyl, ethyl, propyl or vinyl group, and x is an integer from 0 to 4.

cyclic-$(SiR^1R^2—O)_n$ [Chemical Formula 3]

wherein, $R^1$ and $R^2$ are independently or simultaneously hydrogen, straight or branched C1–10 alkyl or alkenyl group substituted or unsubstituted by C1–5 alkyl or alkenyl group, and preferably $R^1$ and $R^2$ are independently or simultaneously hydrogen, methyl, ethyl, propyl or vinyl group.

The oxidant is preferably selected from the group consisting of $O_2$, $N_2O$, $NO$, $CO_2$, $CO$, ozone, and a mixture thereof.

The a-SiCOH thin film vapor deposited by the process of the present invention can be used for an insulating film during the manufacturing process of a semiconductor device, preferably a liquid crystal display device, to cover a semiconductor layer of a liquid crystal display device thereby effectively protecting the semiconductor layer.

As explained above, if a low dielectric insulating film is vapor deposited while optimizing compositional ratios of each gas by the process according to the present invention, the vapor deposition speed can be greatly improved, and thus a drop in throughput occurring as a result of increases in thickness by 10 times or more compared to the existing SiNx thin film can be compensated without damaging mechanical strength and subsequent processes. Also, manufacturing costs resulting from increasing consumption of the comparatively expensive conventional source gas can be reduced.

The present invention will now be explained in more detail with reference to the following Examples. However, the Examples merely illustrate the present invention and the present invention is not limited to them.

EXAMPLES 1 TO 9

Using a capacitively coupled parallel plate PECVD reactor, a low dielectric insulating film was vapor deposited on a bare silicon wafer or glass substrate with a reactant gas mixture of trimethylsilane (3MS), silane ($SiH_4$), nitrous oxide ($N_2O$) and argon (Ar). A vapor deposition temperature was 270° C., and other parameters (i.e., dielectric constant and growth speed) for a PECVD process of the Examples are shown in Table 1.

Light transmittances for the insulating films formed on a glass substrate were measured. All showed a light transmittance of 95% or more at a wavelength range of 400 to 800 nm.

TABLE 1

| | | Electric power | Pressure (Torr) | 3MS (sccm) | $N_2O$ (sccm) | Ar (sccm) | $SiH_4$ (sccm) | Total flow rate (sccm) | Vapor deposition speed microns/min | Kavg |
|---|---|---|---|---|---|---|---|---|---|---|
| Exam. | 1 | 1500 | 2.5 | 375 | 1688 | 750 | 187.5 | 3000 | 1.006 | 3.119 |
| | 2 | 1500 | 2.5 | 375 | 2813 | 1100 | 187.5 | 4475 | 1.08 | 3.375 |
| | 3 | 1500 | 2.5 | 375 | 3938 | 1500 | 187.5 | 6000 | 1.04 | 3.520 |
| | 4 | 1500 | 2.5 | 375 | 2250 | 1000 | 375 | 4000 | 1.248 | 3.216 |
| | 5 | 1500 | 2.5 | 375 | 3750 | 1500 | 375 | 6000 | 1.296 | 3.621 |
| | 6 | 1500 | 2.5 | 375 | 5250 | 2000 | 375 | 8000 | 1.266 | 3.897 |
| | 7 | 1500 | 2.5 | 375 | 1125 | 500 | 0 | 2000 | 0.506 | 3.043 |
| | 8 | 1500 | 2.5 | 375 | 1875 | 800 | 0 | 3050 | 0.644 | 3.121 |
| | 9 | 1500 | 2.5 | 375 | 2625 | 1000 | 0 | 4000 | 0.728 | 3.173 |

Figure 2:
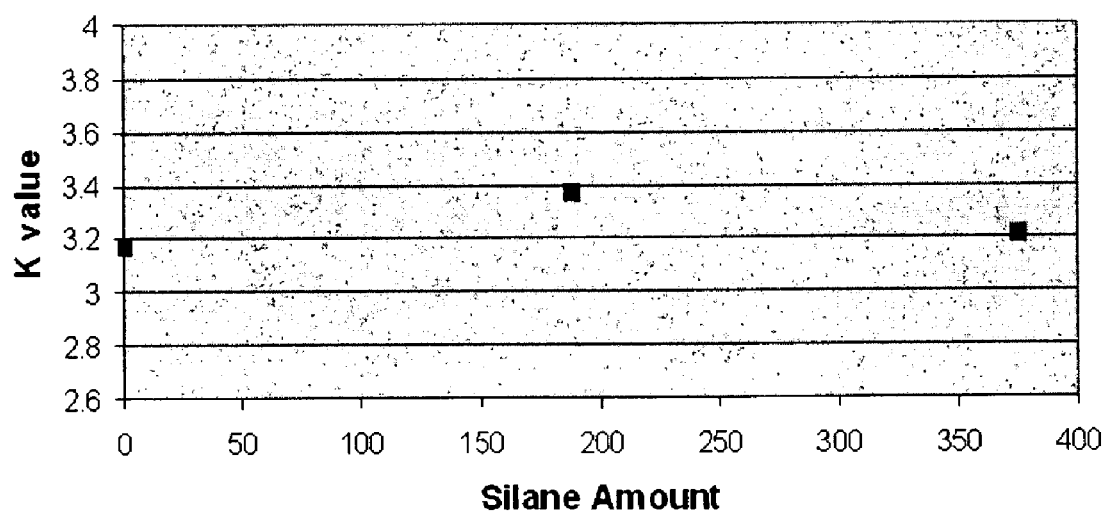
FIG. 2 shows changes in a dielectric constant of a-SiCOH thin film according to the addition of silane ($SiH_4$) gas.

As shown in FIG. 1, the vapor deposition speed increased by approximately 60% or more by adding $SiH_4$ gas to source gas. If other vapor deposition parameters are favorably controlled, the dielectric constant (k) can be constantly maintained even if the amount of $SiH_4$ increases (FIG. 2).

Figure 3:
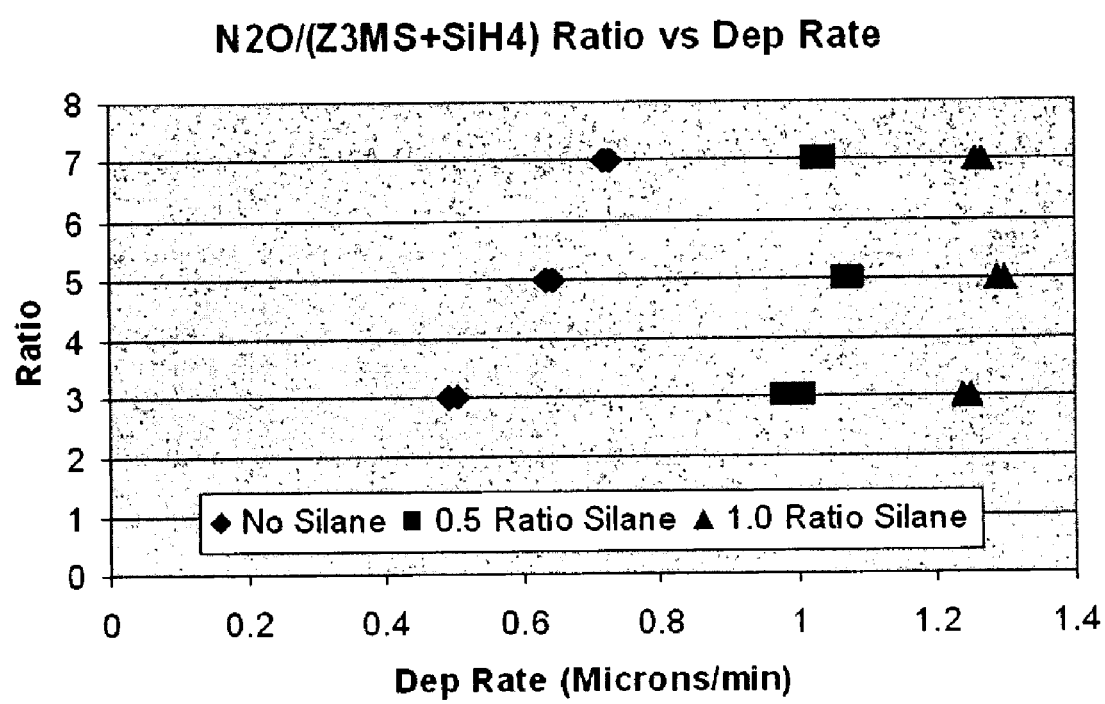
FIG. 3 shows changes in a-SiCOH thin film vapor deposition speed according to the addition of silane ($SiH_4$) gas and a flow rate of $N_2O$.

FIG. 3 shows changes in a vapor deposition speed for a-SiCOH thin film according to the addition of $SiH_4$ and a flow rate of oxidant, in the case of not adding $SiH_4$ (blue diamonds), adding $SiH_4$ corresponding to ½ of main source gas (red squares), and adding $SiH_4$ in the same amount of source gas (green triangles). Vertical axis (y) represents the ratio of oxidant $N_2O$ gas to Si containing gas [Z3MS+$SiH_4$].

As shown in FIG. 3, the vapor deposition speed is also related to the flow rate of $N_2O$. In the case where $SiH_4$ is not added, as the ratio of oxidant/source gas (for example, $N_2O$/Z3MS) increases, the vapor deposition speed tends to increase. However, in the case where $SiH_4$ is added, even if the flow rate of an oxidant (for example, $N_2O$) increases, the vapor deposition speed changes little. Therefore, it is clear that vapor deposition speed improvement effects predominantly result from the addition of $SiH_4$ rather than control of the flow rate of an oxidant.

Figure 4:
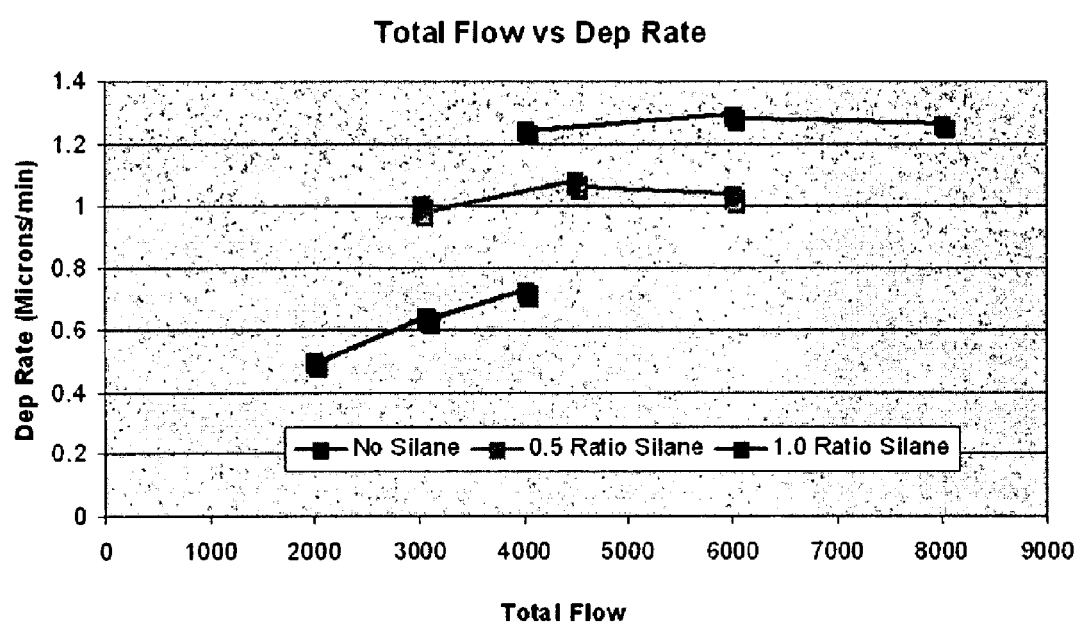
FIG. 4 shows changes in a vapor deposition speed according to flow rates of total source gases [Z3MS+$N_2O$+$SiH_4$]

FIG. 4 shows changes in the vapor deposition speed when increasing the total flow rate [source gas+oxidant+$SiH_4$] by 1.5 and 2 times at each different level of $SiH_4$ amount. In the case where $SiH_4$ is not added, when the flow rate [source gas+oxidant] increases by 1.5 times (2000 sccm→3000 sccm), the vapor deposition speed merely increases by about 25%. However, when $SiH_4$ is added instead of source gas and the total flow rate increases to 3000 sccm, the vapor deposition speed increases by about 100%. Further, in the case where $SiH_4$ is added, the vapor deposition speed changes little with changes in the total flow rate, and thus it is confirmed that the effects of the addition of $SiH_4$ are dominant.

Figure 5:
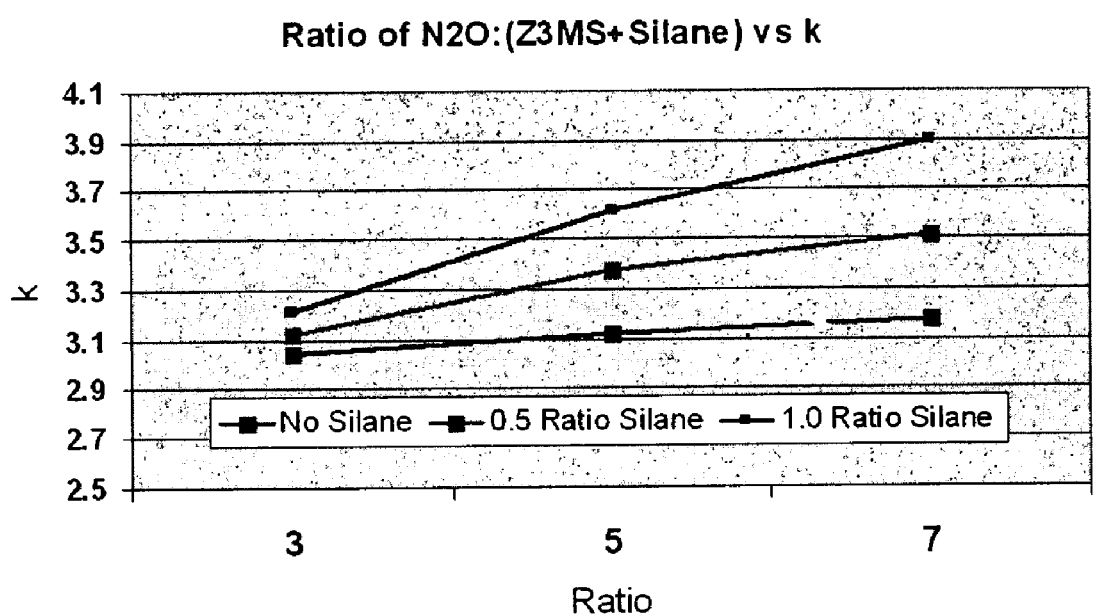
FIG. 5 shows changes in a dielectric constant of a-SiCOH thin film according to the addition of silane ($SiH_4$) gas and a flow rate of $N_2O$.

FIG. 5 shows changes in a dielectric constant of a-SiCOH thin film according to the addition of $SiH_4$ and a flow rate of an oxidant in the different instances of when $SiH_4$ is not added, when $SiH_4$ is added corresponding to ½ of a source gas, and when $SiH_4$ is added in the same amount of the source gas. The horizontal axis (x) represents a ratio of an oxidant ($N_2O$):(source gas+$SiH_4$).

As shown in FIG. 5, although changes in the dielectric constant according to the addition of $SiH_4$ is slight within an experimental error range when the ratio of oxidant to Si containing gas [$N_2O$/(Z3MS+$SiH_4$)] is 3, when the ratio increases, the addition of $SiH_4$ results in a corresponding increase in the dielectric constant. Therefore, if the ratio of [$N_2O$/(Z3MS+$SiH_4$)] is controlled to within 3, the vapor deposition speed can be significantly improved while maintaining a low dielectric constant by the addition of $SiH_4$.

As explained above, according to the present invention, the vapor deposition speed can be greatly improved while maintaining the physical properties of insulating film by forming a protection film with an a-SiCOH film (low dielectric insulating film) vapor deposited using silane gas. Accordingly, parasitic capacitance problems can be solved to realize a high aperture ratio structure and the process time can be reduced.

What is claimed is:

1. A process for vapor depositing a low dielectric insulating film for a semiconductor device comprising the step of vapor depositing an a-SiCOH thin film by a CVD or PECVD method by supplying a reactant gas mixture comprising a gas phase main source, silane ($SiH_4$), and an oxidant to a vapor deposition chamber comprising a substrate, wherein the main source gas is selected as one or more in the group consisting of organosilicon compounds represented by the following Chemical Formulae 1, 2 and 3, wherein the ratio of silane ($SiH_4$) gas to main source gas is 1:0.5 to 1, and wherein the vapor deposition rate of a low dielectric insulating film is 1.006 to 1.266 microns/min:

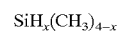    [Chemical Formula 1]

wherein, x is an integer, that is, 0, 1, 2 or 3,

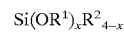    [Chemical Formula 2]

wherein, $R^1$ and $R^2$ are independently or simultaneously straight or branched C1–10 alkyl or alkenyl group substituted or unsubstituted by C1–5 alkyl or alkenyl group, and preferably $R^1$ and $R^2$ are independently or simultaneously methyl, ethyl, propyl or vinyl group, and x is an integer from 0 to 4.

    [Chemical Formula 3]

wherein, $R^1$ and $R^2$ are independently or simultaneously hydrogen, straight or branched C1–10 alkyl or alkenyl group substituted or unsubstituted by C1–5 alkyl or alkenyl group, and preferably $R^1$ and $R^2$ are independently or simultaneously hydrogen, methyl, ethyl, propyl or vinyl group.

2. The process for vapor depositing a low dielectric insulating film according to claim 1, wherein the a-SiCOH thin film has a dielectric constant of 3.6 or less, and a light transmittance of 95% or more at a wavelength range of 400 to 800 nm.

3. The process for vapor depositing a low dielectric insulating film according to claim 1, wherein the substrate is selected from the group consisting of a liquid crystal display device, a light emitting diode display device, and an organic light emitting diode display device.

4. The process for vapor depositing a low dielectric insulating film according to claim 1, wherein the a-SiCOH thin film is used for an insulating film for a liquid crystal display device.

5. The process for vapor depositing a low dielectric insulating film according to claim 1, wherein the oxidant is selected from the group consisting of $O_2$, $N_2O$, NO, $CO_2$, CO, ozone, and a mixture thereof.

6. The process for vapor depositing a low dielectric insulating film according to claim 1, wherein the a-SiCOH thin film is vapor deposited by a PECVD method by exposing a reactant gas mixture to a plasma at a power density of 0.2 to 1.5 mW/cm$^2$, under a pressure of 1 to 10,000 Torr, and at a temperature of 25 to 300°C.

* * * * *